(12) United States Patent
Maeda (10) Patent No.: US 11,177,148 B2
(45) Date of Patent: Nov. 16, 2021

(54) LASER PROCESSING APPARATUS

(71) Applicant: DISCO CORPORATION, Tokyo (JP)

(72) Inventor: Tsutomu Maeda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 330 days.

(21) Appl. No.: 16/040,984

(22) Filed: Jul. 20, 2018

(65) Prior Publication Data
US 2019/0043743 A1    Feb. 7, 2019

(30) Foreign Application Priority Data

Aug. 1, 2017 (JP) .............................. JP2017-149164

(51) Int. Cl.
| | |
|---|---|
| *H01L 21/67* | (2006.01) |
| *H01L 21/68* | (2006.01) |
| *G06T 7/00* | (2017.01) |
| *B23K 26/364* | (2014.01) |
| *H01L 21/687* | (2006.01) |
| *H01L 23/544* | (2006.01) |

(Continued)

(52) U.S. Cl.
CPC ...... *H01L 21/67282* (2013.01); *B23K 26/364* (2015.10); *G06T 7/0004* (2013.01); *G06T 7/0006* (2013.01); *H01L 21/681* (2013.01); *H01L 21/68764* (2013.01); *H01L 23/544* (2013.01); *H01L 29/2003* (2013.01); *G06T 7/521* (2017.01); *G06T 2207/30148* (2013.01); *H01L 21/67092* (2013.01); *H01L 2223/5446* (2013.01); *H01L 2223/54426* (2013.01); *H01L 2223/54453* (2013.01); *H01L 2223/54493* (2013.01)

(58) Field of Classification Search
CPC ......... H01L 21/67282; H01L 21/68764; H01L 23/544

USPC ................ 219/121.6–121.62, 121.78–121.81
See application file for complete search history.

(56) References Cited

U.S. PATENT DOCUMENTS

| | | | | |
|---|---|---|---|---|
| 2013/0213946 | A1* | 8/2013 | Morikazu | ............ B23K 26/40 |
| | | | | 219/121.85 |
| 2018/0236597 | A1* | 8/2018 | Okuma | .................. B23K 26/03 |
| 2018/0236608 | A1* | 8/2018 | Okuma | ................ B23K 26/364 |

FOREIGN PATENT DOCUMENTS

| | | | | |
|---|---|---|---|---|
| JP | 2002192370 | * | 7/2002 | ............ B23K 26/40 |
| JP | 2002192370 A | | 7/2002 | |

OTHER PUBLICATIONS

Machine Translation of JP2002192370,Jun. 2020 (Year: 2020).*

* cited by examiner

*Primary Examiner* — Tu B Hoang
*Assistant Examiner* — Thomas J Ward
(74) *Attorney, Agent, or Firm* — Greer, Burns & Crain, Ltd.

(57) ABSTRACT

A laser processing apparatus has a control unit including an inspection modified layer former detecting a provisional orientation flat of a bare wafer and applying a laser beam of a predetermined output power level to the bare wafer depending on the direction of the provisional orientation flat thereby to form a modified layer for detecting the crystal orientation closely to an outer edge of the bare wafer, and a crack detector detecting a crack extending from the modified layer toward a Y-axis and an exposed surface of the bare wafer, providing the modified layer extends along an X-axis in an image captured of the modified layer. If the crack detector detects no crack, the control unit determines the modified layer with no crack extending therefrom as extending parallel to the crystal orientation of the bare wafer.

7 Claims, 7 Drawing Sheets

(51) Int. Cl.
*H01L 29/20* (2006.01)
*G06T 7/521* (2017.01)

LASER PROCESSING APPARATUS

BACKGROUND OF THE INVENTION

Field of the Invention

The present invention relates to a laser processing apparatus.

Description of the Related Art

LEDs (Laser Emitting Diodes) have been used not only in display light sources, but also in illumination light sources on account of their increased luminance. Particularly, illumination light sources that are used in applications that need to meet demands for high luminance and stability requirements are automobile lights. Automobile lights are required to emit stable illumination light at a certain level of luminance while in use for the purpose of safety. Therefore, it is necessary that LED devices for use in such applications be manufactured with high reliability. It is known in the art that when a GaN wafer with a plurality of LED devices formed on its surface is divided into chips during an LED device fabrication process, variations in luminance levels of the chips are very small if the GaN wafer is divided along the crystal orientation. Consequently, there has been a need for accurate division initiating points to be established in wafers for dividing the wafers into chips. The level of accuracy required for division initiating points is so strict that any angular deviation of the division initiating points from the crystal orientation should be kept within an angular deviation error range of 0.005°, for example.

For dividing a wafer with LED devices formed on its surface, there is known, in addition to a process of cutting a wafer with a cutting blade or a diamond scribe, a dividing method in which a laser beam is applied to a wafer to form modified layers in the wafer that serve as division initiating points (see, for example, Japanese Patent No. 3408805).

SUMMARY OF THE INVENTION

For forming modified layers in a wafer with a laser beam, it is customary to form modified layers parallel to projected dicing lines formed in advance on the wafer such that the modified layers lie along the crystal orientation of the wafer. An orientation flat on a wafer, which represents a mark for directions along which to form projected dicing lines on the wafer, usually deviates from the crystal orientation by 0.5° or smaller. If modified layers are formed in a wafer along directions parallel to the projected dicing lines that have been formed along an orientation flat with such an angular deviation, then the modified layers may possibly fail to meet the accuracy level of up to 0.005° for the division initiating points. For the above reasons, it has been desirous in the art of accurately detecting the crystal orientation of a wafer and forming an orientation flat on the wafer in a manner to meet the accuracy level required for division initiating points.

It is therefore an object of the present invention to provide a laser processing apparatus which is capable of forming an orientation flat on a wafer in a manner to meet the accuracy level required for division initiating points.

In accordance with an aspect of the present invention, there is provided a laser processing apparatus for recognizing a correct crystal orientation of a bare wafer having a provisional orientation flat that represents a general crystal orientation of the bare wafer, the laser processing apparatus including a chuck table for holding a wafer thereon, the chuck table being rotatable about its own axis, a laser beam applying unit configured to apply a laser beam having a wavelength that can be transmitted through the wafer to the wafer held on the chuck table, a camera for capturing an image of the wafer held on the chuck table, and a control unit configured to control at least the chuck table, the laser beam applying unit, and the camera, in which the control unit includes an inspection modified layer former detecting the provisional orientation flat of the bare wafer and applying a laser beam of a predetermined output power level to the bare wafer depending on the direction of the provisional orientation flat thereby to form a modified layer for detecting the crystal orientation closely to an outer edge of the bare wafer, and a crack detector detecting a crack extending from the modified layer toward a Y-axis and an exposed surface of the bare wafer, providing the modified layer extends along an X-axis in an image captured of the modified layer by the camera, and in which if the crack detector detects no crack, the control unit determines the modified layer with no crack extending therefrom as extending parallel to the crystal orientation of the bare wafer.

The laser processing apparatus according to the present invention is capable of forming an orientation flat on a bare wafer which meets accuracy requirements for a division initiating point.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIGS. 5-1A through 5-1D are schematic views depicting the directions of cracks developed from modified layers by the laser processing apparatus according to the embodiment;

FIGS. 5-2A and 5-2B are schematic views depicting the directions of cracks developed from modified layers by the laser processing apparatus according to the embodiment;

DETAILED DESCRIPTION OF THE PREFERRED EMBODIMENT

A preferred embodiment of the present invention will be described in detail below with reference to the drawings. The present invention is not limited to the details of the embodiment described below. The components described below cover those which could easily be envisaged by those skilled in the art and those which are essentially identical to those described above. Furthermore, the arrangements described below can be used in appropriate combinations. Various omissions, replacements, or changes of the arrangements may be made without departing from the scope of the present invention.

A laser processing apparatus 1 according to the present embodiment will be described below with reference to FIGS. 1 and 2. The laser processing apparatus 1 finds accurately the crystal orientation of a bare wafer 200 with a provisional orientation flat 205 (see FIG. 3) formed thereon that represents a rough crystal orientation, and forms a final orientation flat 209 (see FIG. 6) along the correct crystal orientation on the bare wafer 200.

Figure 3:
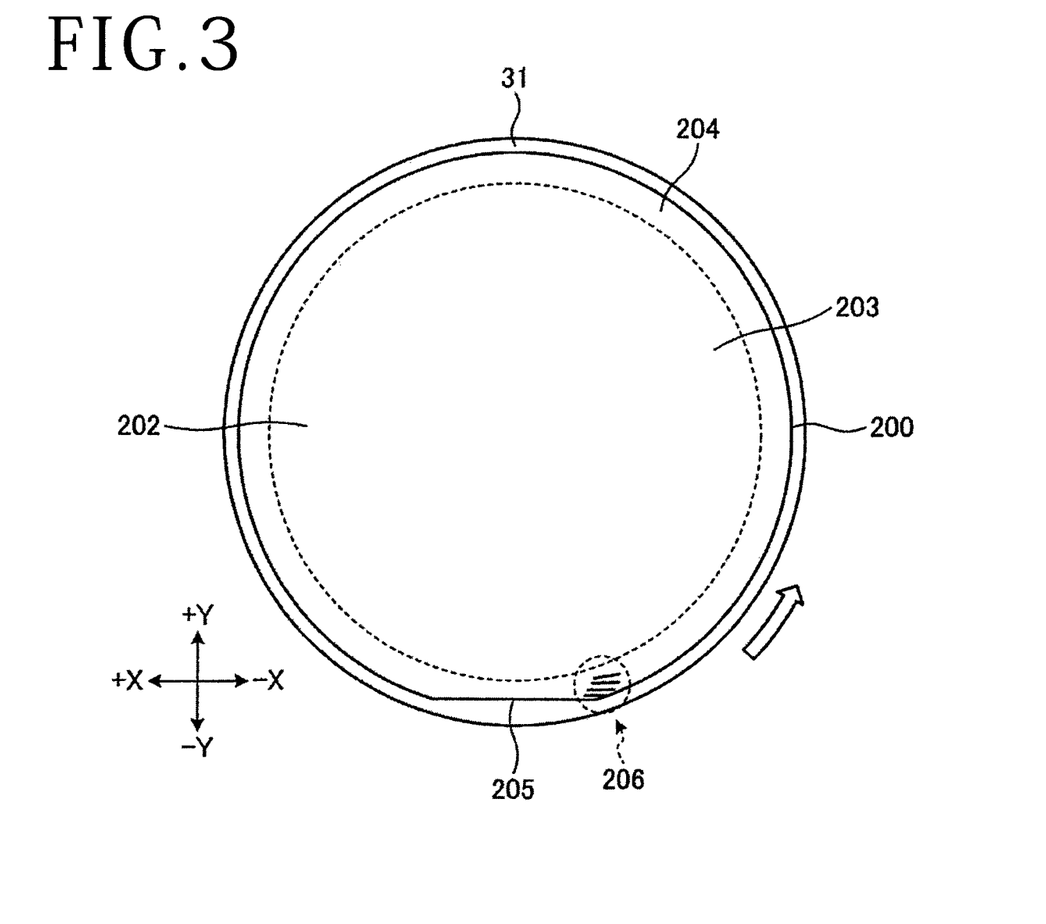
FIG. 3 is a plan view of a wafer with a provisional orientation flat formed thereon, to be processed by the laser processing apparatus according to the embodiment.

The bare wafer 200 will be described below with reference to FIG. 3. The bare wafer 200 is a wafer that is sliced from an ingot of base material, but free of devices and projected dicing lines to be formed thereon by lithography. The bare wafer 200 has a face side 201 stuck to the surface of an adhesive tape 220 that is attached to an annular frame 210 and a reverse side 202 exposed through the opening of the annular frame 210. The bare wafer 200 has a device area 203 where a plurality of devices are formed and an outer extra area (outer edge vicinity area) 204 surrounding the outer periphery of the device area 203. In FIG. 3, the boundary between the device area 203 and the outer extra area 204 is indicated by a broken line. The bare wafer 200 may be a circular semiconductor wafer or optical device wafer. According to the present embodiment, the bare wafer 200 includes a GaN wafer.

The bare wafer 200 has the provisional orientation flat 205 formed thereon that indicates a rough crystal orientation of the bare wafer 200. According to the present embodiment, the provisional orientation flat 205 extends generally parallel to the crystal orientation of GaN. The provisional orientation flat 205 serves as a mark for directions along which to form projected dicing lines on the bare wafer 200. The provisional orientation flat 205 extends in a direction that includes an angular error of approximately 0.1° with respect to the crystal orientation of GaN.

According to the present embodiment, in FIG. 3, the outer extra area 204 includes an inspection area 206 indicated by a broken-line circle close to the provisional orientation flat 205. The inspection area 206 is an area in which to form a modified layer 207 for inspection (see FIG. 2) for detecting the crystal orientation of the bare wafer 200.

The modified layer 207 for inspection may be shorter than the provisional orientation flat 205. Specifically, the modified layer 207 for inspection may be long enough to confirm whether, providing the modified layer 207 for inspection extends along an X-axis, there is developed or not a crack 208 in the bare wafer 200 that extends toward a Y-axis and/or toward the exposed reverse side 202 of the bare wafer 200. For example, the modified layer 207 for inspection may be of a length approximately in the range of 5 to 20 mm.

Figure 1:
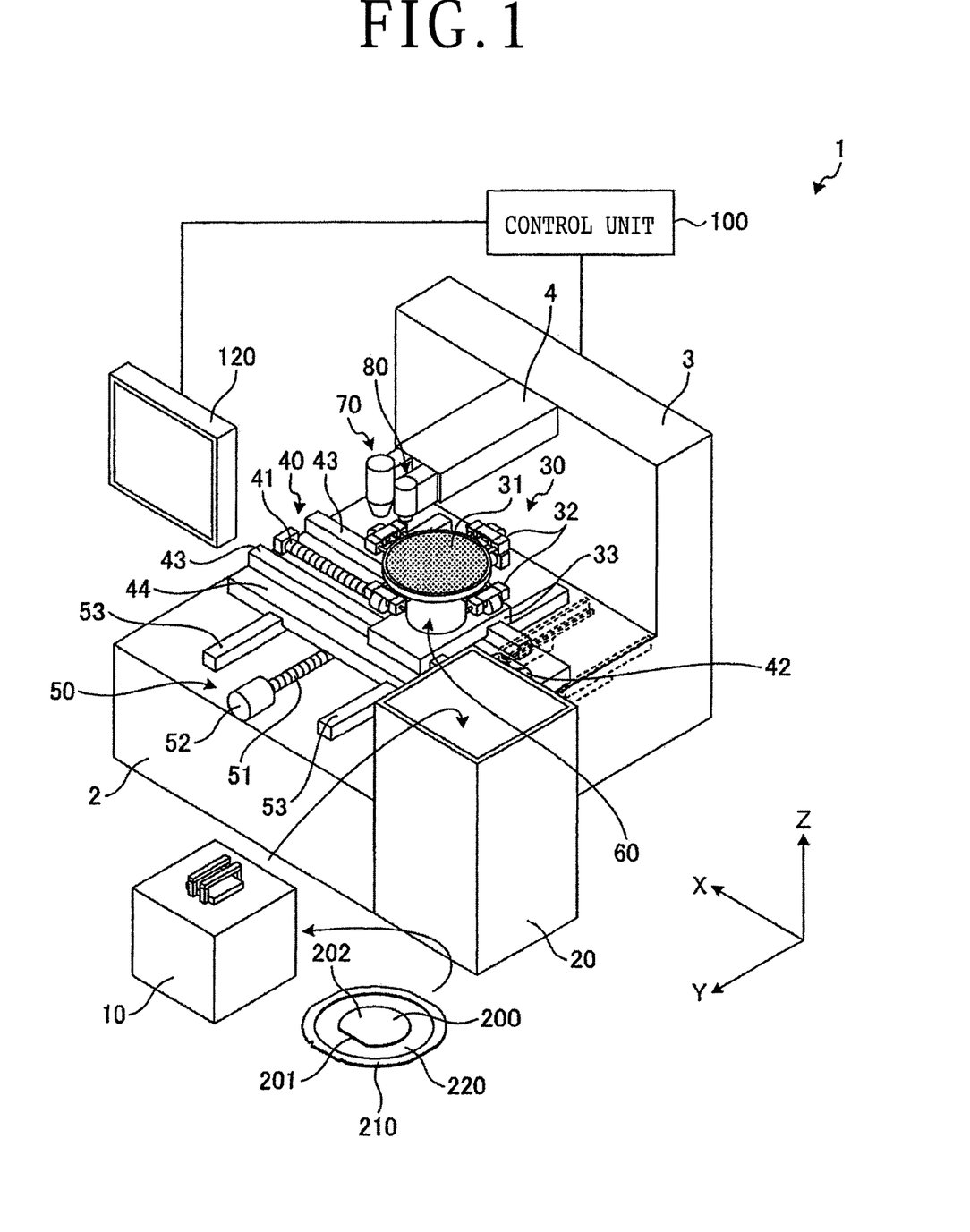
FIG. 1 is a perspective view of a laser processing apparatus according to an embodiment of the present invention.
Figures 1A, 5:
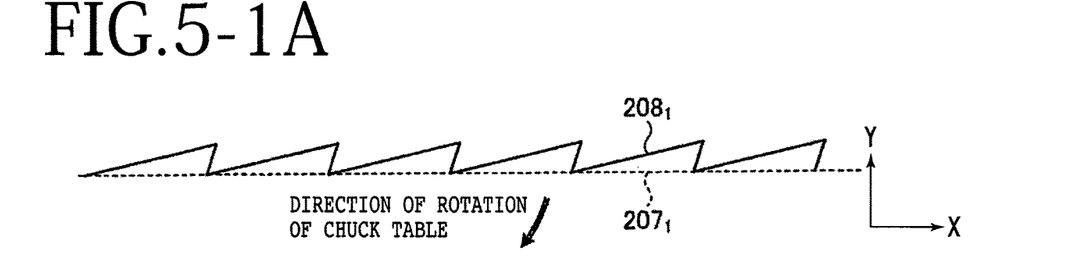
Figures 1B, 5:
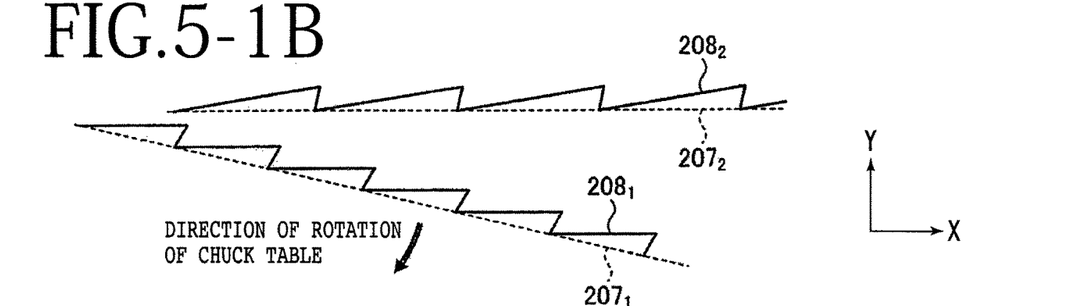
Figures 1C, 5:
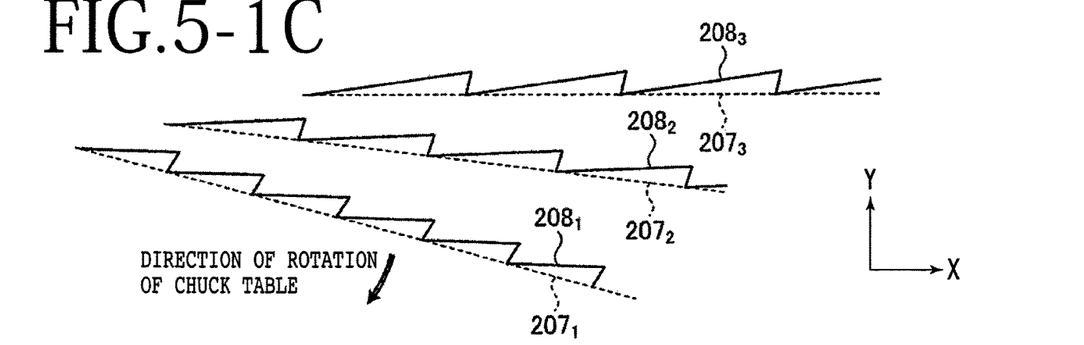
Figures 1D, 5:
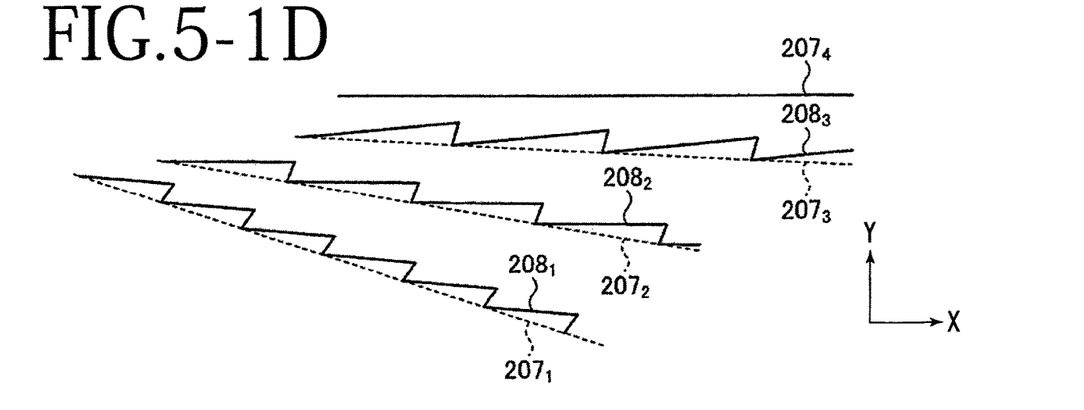
Figure 2:
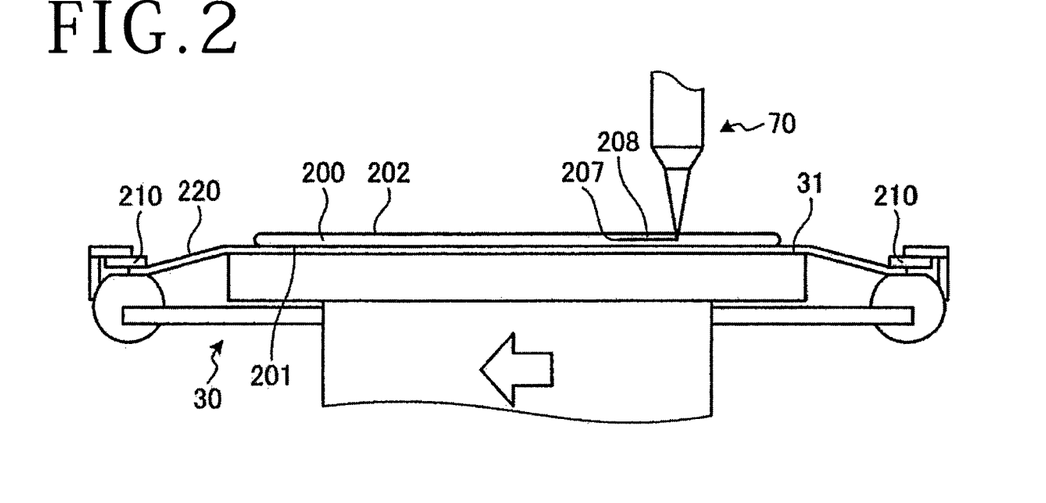
FIG. 2 is a side elevational view, partly in cross section, illustrative of a process of forming modified layers in a wafer with the laser processing apparatus according to the embodiment.
Figures 2A, 5:
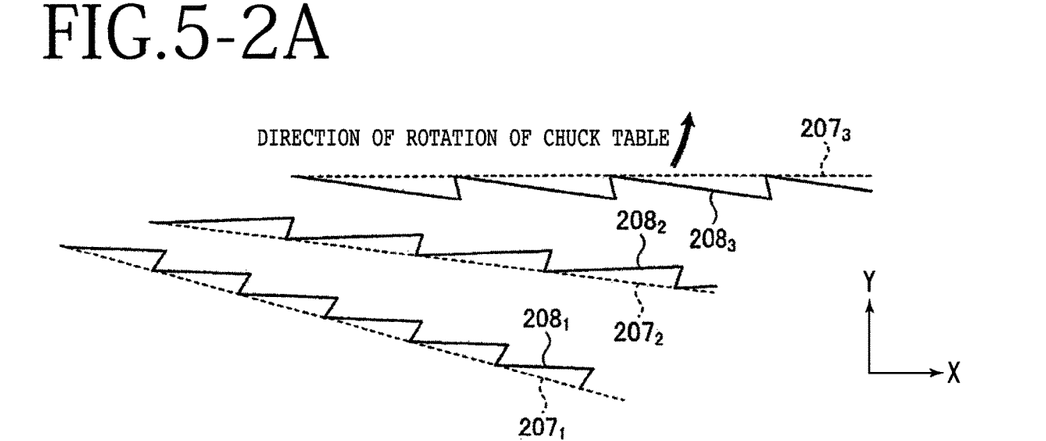
Figures 2B, 5:
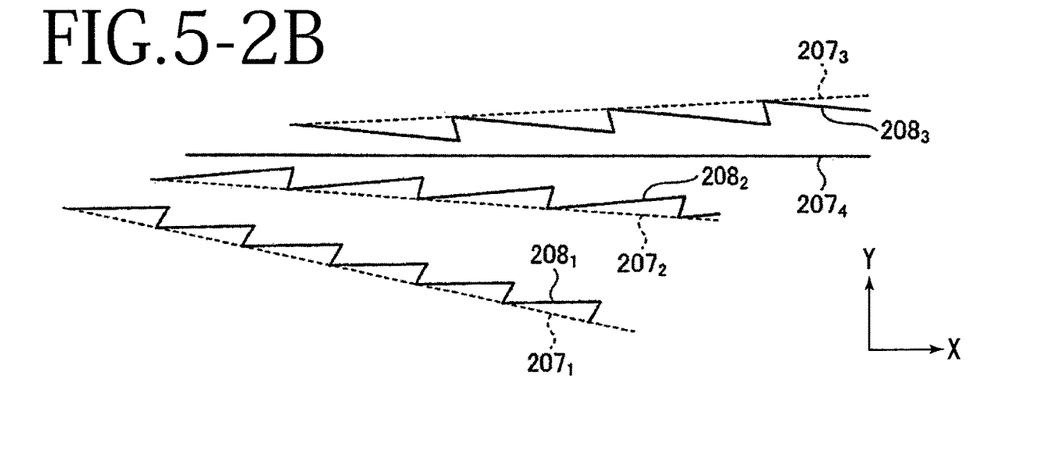

As depicted in FIG. 1, the laser processing apparatus 1 includes a main body 2 in the shape of a substantially rectangular parallelepiped, a wall 3 extending upwardly from a rear side of the main body 2, and a support beam 4 projecting forwardly in a cantilevered fashion from the wall 3.

The laser processing apparatus 1 includes a cassette table 20 for placing thereon a cassette 10 that houses a bare wafer 200 to be processed, a chuck table 30 for holding the bare wafer 200 thereon, a laser beam applying unit 70 for applying a laser beam to the bare wafer 200 held on the chuck table 30 thereby to process the bare wafer 200, an X-axis moving unit 40 for moving the chuck table 30 and the laser beam applying unit 70 relatively to each other in an X-axis direction, a Y-axis moving unit 50 for moving the chuck table 30 and the laser beam applying unit 70 relatively to each other in a Y-axis direction, a rotating unit 60 for rotating the chuck table 30 about a central axis thereof that extends parallel to a Z axis, a camera 80, a control unit 100, and a display panel 120.

The chuck table 30 has a holding surface 31 for holding the bare wafer 200 thereon. The holding surface 31 holds the bare wafer 200 that is stuck to the adhesive tape 220 and positioned in the opening of the annular frame 210. The holding surface 31 is made of a porous material such as porous ceramics or the like and has a disk shape, and is connected to a vacuum suction source, not depicted, through a vacuum suction channel, not depicted. Therefore, the holding surface 31 attracts and holds the bare wafer 200 placed thereon under suction through the adhesive tape 220. The chuck table 30 is surrounded by a plurality of clamps 32 disposed therearound that clamp the annular frame 210 around the bare wafer 200.

The X-axis moving unit 40 serves as processing-feed means for moving the chuck table 30 in the X-axis direction to processing-feed the chuck table 30 in the X-axis direction. The X-axis moving unit 40 includes a ball screw 41 rotatable about its own central axis, a stepping motor 42 for rotating the ball screw 41 about its central axis, and a pair of guide rails 43 supporting the chuck table 30 for guiding the chuck table 30 to move in the X-axis direction.

The Y-axis moving unit 50 serves as indexing-feed means for moving the chuck table 30 in the Y-axis direction to indexing-feed the chuck table 30 in the Y-axis direction. The Y-axis moving unit 50 includes a ball screw 51 rotatable about its own central axis, a stepping motor 52 for rotating the ball screw 51 about its central axis, and a pair of guide rails 53 supporting the chuck table 30 for guiding the chuck table 30 to move in the Y-axis direction.

The rotating unit 60 rotates the chuck table 30 about the central axis thereof that extends parallel to the Z axis. The rotating unit 60 is disposed on a movable table 33 that is movable in the X-axis direction by the X-axis moving unit 40.

The laser beam applying unit 70 performs a laser processing operation on the bare wafer 200 held on the chuck table 30. Specifically, the laser beam applying unit 70 applies a laser beam having a wavelength that can be transmitted through the bare wafer 200 to the bare wafer 200 that is held on the chuck table 30, thereby forming modified layers in the bare wafer 200. The laser beam applying unit 70 includes a laser oscillator for oscillating a laser beam and a beam condenser for focusing the laser beam at a desired position in the bare wafer 200. The laser beam applying unit 70 is mounted on the distal end of the support beam 4.

The laser beam applying unit 70 forms a modified layer 207 for inspection in the bare wafer 200 under the following conditions, for example. If the laser beam applied to the bare wafer 200 is focused at a position, i.e., a focused point, in the bare wafer 200 that is close to the upper exposed surface, i.e., the reverse side 202, of the bare wafer 200, then the bare wafer 200 tends to develop cracks that extend from a modified layer formed in the bare wafer 200 to the exposed surface thereof.

Light source: YAG pulse laser
Depth of the focused point from the upper surface of the wafer: 30 μm Pulsed beam output power: 0.08 W
Processing-feed speed: 100 mm/second The laser beam applying unit 70 forms a modified layer $207_0$ (see FIG. 6) for forming an orientation flat in the bare wafer 200 under the following conditions, for example. For forming the modified layer $207_0$ for forming an orientation flat in the bare wafer 200, the laser beam applying unit 70 may apply a laser beam while moving a plurality of times in the X-axis direction. According to the present embodiment, specifically, the laser beam applying unit 70 applies a laser beam while moving in "five passes," i.e., in five times, in the X-axis direction.

Light source: YAG pulse laser
First Pass
Depth of the focused point from the upper surface of the wafer: 30 μm
Pulsed beam output power: 0.08 W
Processing-feed speed: 100 mm/second
Second Pass
Depth of the focused point from the upper surface of the wafer: 120 μm
Pulsed beam output power: 0.14 W
Processing-feed speed: 100 mm/second
Third Pass
Depth of the focused point from the upper surface of the wafer: 90 μm
Pulsed beam output power: 0.10 W
Processing-feed speed: 100 mm/second
Fourth Pass
Depth of the focused point from the upper surface of the wafer: 70 μm
Pulsed beam output power: 0.10 W
Processing-feed speed: 100 mm/second
Fifth Pass
Depth of the focused point from the upper surface of the wafer: 50 μm
Pulsed beam output power: 0.08 W
Processing-feed speed: 100 mm/second The camera 80, which serves to capture, from above, an image of the bare wafer 200 held on the chuck table 30, is disposed in side-by-side relation to the laser beam applying unit 70 along the X-axis. The camera 80 is mounted on the distal end of the support beam 4. The camera 80 may be of the type for detecting visible light or may be an image capturing device of the type for detecting a radiation in the infrared range that is hard to be absorbed by the bare wafer 200. The camera 80 outputs a captured image to the control unit 100.

Figure 4:
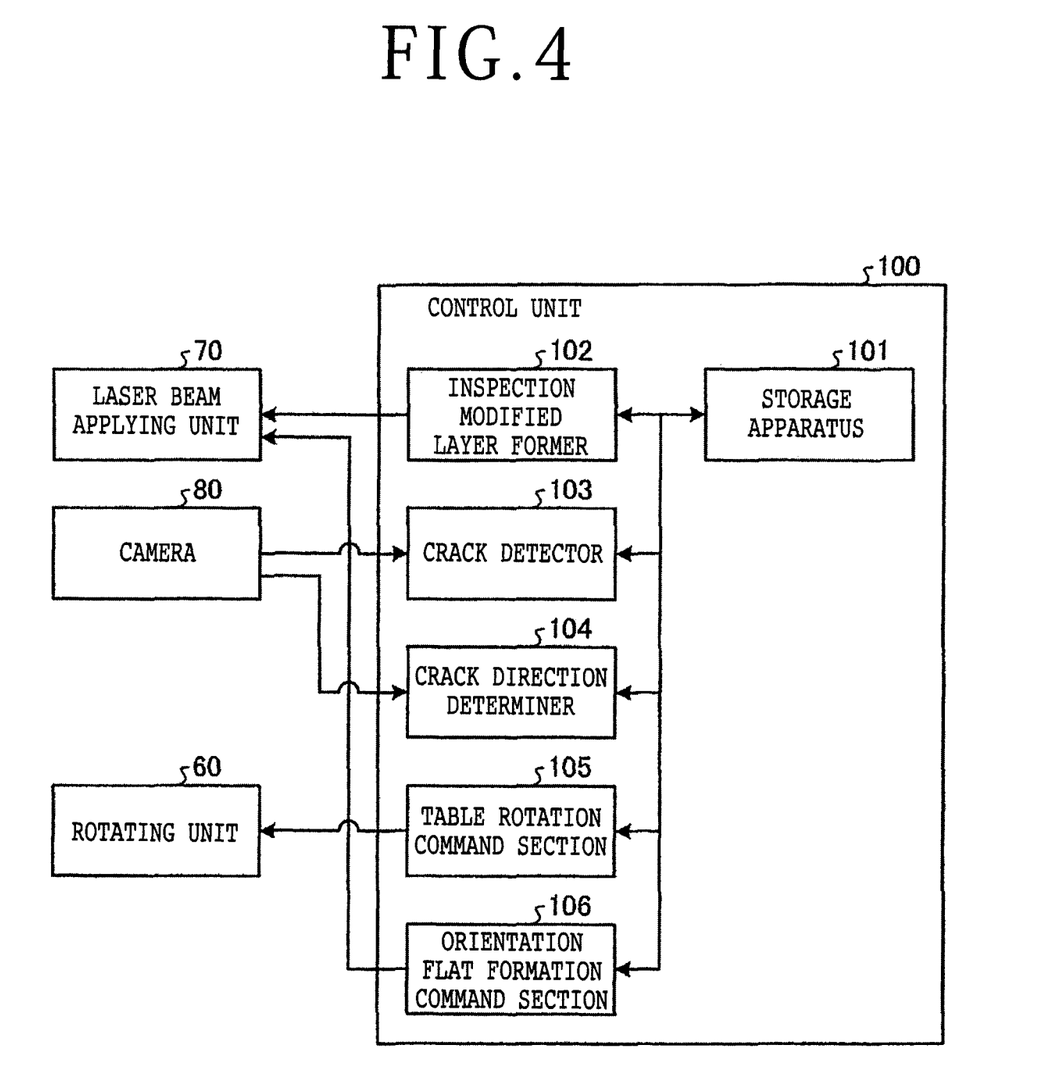
FIG. 4 is a block diagram of a control unit of the laser processing apparatus according to the embodiment.

The control unit 100 will be described below with reference to FIG. 4. The control unit 100 controls some of the various components described above of the laser processing apparatus 1 to enable the laser processing apparatus 1 to perform a laser processing operation on the bare wafer 200. The control unit 100 includes a computer system. The control unit 100 is an arithmetic processing unit having a microprocessor such as a CPU (Central Processing Unit). The control unit 100 performs arithmetic processing sequences according to computer programs stored in a storage apparatus 101, and outputs control signals for controlling the laser processing apparatus 1 to the various components described thereof. The control unit 100 is connected to the display panel 120 for displaying states of the laser processing apparatus 1 and captured images.

The control unit 100 includes the storage apparatus 101, an inspection modified layer former 102, a crack detector 103, a crack direction determiner 104, a table rotation command section 105, and an orientation flat formation command section 106.

The storage apparatus 101 has a memory such as a ROM (Read Only Memory) or a RAM (Random Access Memory). The storage apparatus 101 stores programs and data required for processing sequences carried out by the control unit 100. The storage apparatus 101 stores processing conditions by which to process the bare wafer 200.

The inspection modified layer former 102 detects the provisional orientation flat 205 on the bare wafer 200 and applies a laser beam to the inspection area 206 of the bare wafer 200 depending on the direction of the provisional orientation flat 205 under predetermined processing conditions, thereby forming a modified layer 207 for inspection in the inspection area 206.

The crack detector 103 carries out an image processing process on an image captured of the modified layer 207 for inspection by the camera 80, and detects a crack 208 (see FIG. 2) which, providing the modified layer 207 for inspection, i.e., the processing-feed direction along which the laser beam was applied, extends along the X-axis in the captured image, extends from the modified layer 207 for inspection toward the Y-axis and toward the exposed reverse side 202 of the bare wafer 200.

The crack 208 will be described in detail with reference to FIGS. 5-1A through 5-1D and FIGS. 5-2A and 5-2B. If the direction in which the modified layer 207 for inspection extends deviates from the crystal orientation beyond an angular deviation error range, then a crack 208 is formed in a step-like pattern having an X-axis component and a Y-axis component providing the modified layer 207 for inspection extends along the X-axis. In FIGS. 5-1A through 5-2B, cracks $208_1$ through $208_3$ developed respectively from first through third inspection modified layers $207_1$ through $207_3$ formed in the bare wafer 200 are formed in a step-like pattern. If the direction in which the modified layer 207 for inspection extends deviates from the crystal orientation within the angular deviation error range, then only the modified layer 207 for inspection is formed and no crack is developed or a smaller number of crack steps than a predetermined count per unit length are developed. In FIGS. 5-1A through 5-2B, a fourth modified layer $207_4$ for inspection is formed straight as depicted in FIGS. 5-1D and 5-2B.

The crack direction determiner 104 carries out an image processing process on an image captured of the modified layer 207 for inspection by the camera 80, and determines on which side of the Y-axis, i.e., a positive side or a negative side, the crack 208 detected by the crack detector 103 is localized and extended in the captured image. Specifically, the crack direction determiner 104 determines on which side of the Y-axis, i.e., a positive side or a negative side, the crests of the steps of the crack 208 in the direction in which the cracks 208 extend are formed in the captured image. The direction of the crack 208 represents the direction in which the modified layer 207 for inspection deviates from the crystal orientation. In other words, the direction of the crack 208 represents the direction in which a next modified layer 207 for inspection is to be formed, i.e., the direction opposite to the direction in which to turn the chuck table 30.

The direction of the crack 208 will be described below with reference to FIGS. 5-1A through 5-2B. In FIGS. 5-1A through 5-1D, the crests of the steps of the cracks $208_1$ through $208_3$ in the direction in which the cracks $208_1$ through $208_3$ extend are formed on the positive side of the Y-axis. In FIG. 5-2A, the crests of the steps of the cracks $208_1$ and $208_2$ in the direction in which the cracks $208_1$ and $208_2$ extend are formed on the positive side of the Y-axis. However, the crests of the steps of the crack $208_3$ in the direction in which the crack $208_3$ extends are formed on the negative side of the Y-axis.

In order to form a modified layer 207 for inspection again in the bare wafer 200, the table rotation command section 105 controls the rotating unit 60 to turn the chuck table 30 through a certain angle in the direction opposite to the direction in which the crack 208 has been localized and extended. The angle through which the chuck table 30 is to turn is established depending on the angular deviation of the provisional orientation flat 205 from the crystal orientation and the angular deviation error range of an orientation flat to be newly formed with respect to the crystal orientation. According to the present embodiment, the angle through which the chuck table 30 is to turn is an indexing angle established depending on the angular deviation of the provisional orientation flat 205 from the crystal orientation and the angular deviation error range of an orientation flat to be newly formed with respect to the crystal orientation. For example, according to the present embodiment, the angular deviation of the provisional orientation flat 205 from the crystal orientation is 0.1° and the angular deviation error range of an orientation flat to be newly formed with respect to the crystal orientation is 0.01°.

According to the present embodiment, the angle through which the chuck table 30 is to turn can be set to a first indexing angle of 0.05°, a second indexing angle of 0.02°, a third indexing angle of 0.01°, or a fourth indexing angle of 0.005°. For example, if the crack 208 is less localized or, stated otherwise, if the number of the steps of the crack 208 is reduced, then the chuck table 30 may be turned through a smaller indexing angle. If the number of the steps of the crack 208 is equal to or smaller than a predetermined number, then the chuck table 30 may be turned through a much smaller indexing angle.

According to the present embodiment, the chuck table 30 is turned through the first indexing angle in the direction opposite to the side where the crack $208_1$ developed by the first modified layer $207_1$ for inspection is localized and extended, and then the second modified layer $207_2$ for inspection is formed in the bare wafer 200. If the direction in which the second crack $208_2$ developed by the second modified layer $207_2$ for inspection extends is the same as the direction in which the first crack $208_1$ was localized and extended, then the chuck table 30 is turned through the first indexing angle in the same direction as the direction in the preceding turning session, and then the third modified layer $207_3$ for inspection is formed in the bare wafer 200. On the other hand, if the direction in which the second crack $208_2$ developed by the second modified layer $207_2$ for inspection extends is opposite to the direction in which the first crack $208_1$ was localized and extended, then the chuck table 30 is turned through the second indexing angle in the opposite direction to the direction in the preceding turning session, and then the third modified layer $207_3$ for inspection is formed in the bare wafer 200. This process is repeated to form a modified layer 207 for inspection from which no crack is developed or from which a smaller number of crack steps than a predetermined count per unit length are developed.

Figure 6:
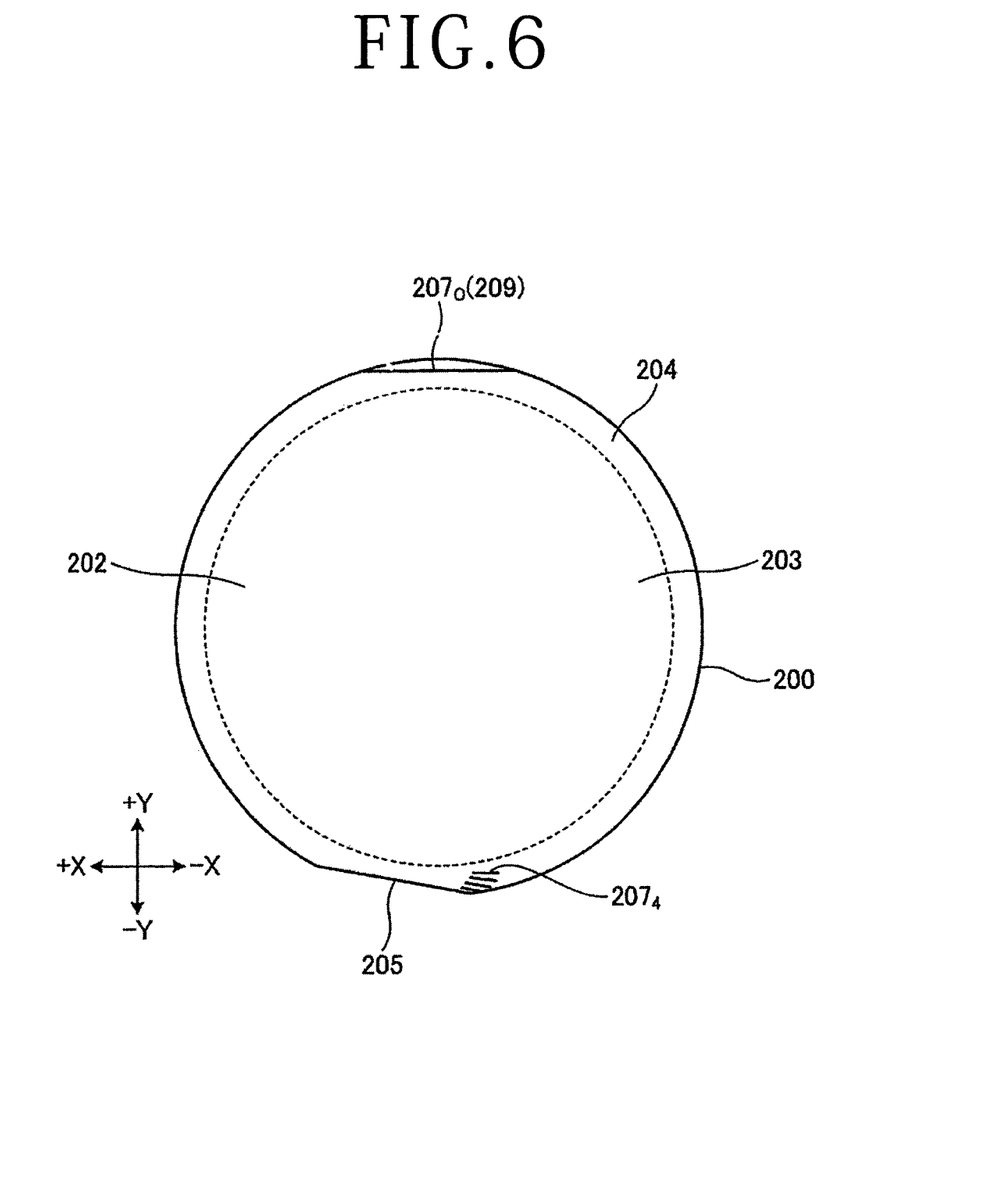
FIG. 6 is a plan view of a wafer with a modified layer formed therein for producing an orientation flat on the wafer with the laser processing apparatus according to the embodiment.

The orientation flat formation command section 106 will be described below with reference to FIG. 6. If the crack detector 103 does not detect a step-like crack 208, or stated otherwise, if only a modified layer 207 for inspection is formed straight, then the orientation flat formation command section 106 controls the laser beam applying unit 70 to apply a laser beam to the bare wafer 200 in the direction parallel to the extending direction of the straight modified layer 207 for inspection under the predetermined processing conditions to form the modified layer $207_O$ for forming an orientation flat in the bare wafer 200. According to the present embodiment, the modified layer $207_O$ for forming an orientation flat is formed in the outer extra area 204 in diametrically opposite relation to the provisional orientation flat 205 across the center of the bare wafer 200.

The display panel 120 includes a liquid crystal display apparatus. Based on a control signal from the control unit 100, the display panel 120 displays an image captured by the camera 80 of the bare wafer 200 held on the chuck table 30.

A method carried out by the laser processing apparatus 1 according to the present embodiment to determine the crystal orientation of the bare wafer 200 and form the modified layer $207_O$ for forming an orientation flat in the bare wafer 200 will be described below with reference to FIG. 7.

First, the operator of the laser processing apparatus 1 places the bare wafer 200 on the chuck table 30 so that the chuck table 30 holds the bare wafer 200 thereon. Specifically, the operator places, on the holding surface 31, the face side 201 of the bare wafer 200 that is stuck on the adhesive tape 220 and positioned in the opening of the annular frame 210, so that the face side 201 is held on the holding surface 31 under suction with the reverse side 202 of the bare wafer 200 being exposed upwardly.

The control unit 100 controls the X-axis moving unit 40 and the Y-axis moving unit 50 to move the chuck table 30 to a position where the bare wafer 200 held on the chuck table 30 is positioned below the camera 80. The control unit 100 then controls the camera 80 to capture an image of the bare wafer 200. The camera 80 outputs the captured image to the control unit 100. The control unit 100 may display the captured image on the display panel 120.

The control unit 100 forms a modified layer 207 for inspection (step SP1) in the bare wafer 200. Specifically, the inspection modified layer former 102 of the control unit 100 detects the provisional orientation flat 205 of the bare wafer 200 from the captured image. The control unit 100 positionally adjusts the bare wafer 200 such that the direction in which the detected orientation flat 205 extends is aligned with the X-axis. The control unit 100 controls the X-axis moving unit 40 and the Y-axis moving unit 50 to move the chuck table 30 to a laser beam application area where the beam condenser is positioned and to place a desired position in the inspection area 206, i.e., a position corresponding to the left end of the modified layer 207 for inspection in FIG. 2, directly below the beam condenser. While the inspection modified layer former 102 is controlling the laser beam applying unit 70 to start applying a laser beam to the bare wafer 200 from the desired position in the inspection area 206 under the processing conditions, the control unit 100 controls the X-axis moving unit 40 to processing-feed the chuck table 30 in the processing-feed direction indicated by the arrow in FIG. 2. The focused point of the laser beam emitted from the laser beam applying unit 70 now moves from the desired position in the inspection area 206 in a direction along the provisional orientation flat 205. After the X-axis moving unit 40 has moved the chuck table 30 by a predetermined distance, the inspection modified layer former 102 controls the laser beam applying unit 70 to stop applying the laser beam, and the control unit 100 controls the X-axis moving unit 40 to stop moving the chuck table 30.

In this manner, the inspection modified layer former 102 forms a modified layer 207 for inspection, specifically, a first modified layer $207_1$ for inspection, in the inspection area 206 of the bare wafer 200 along the direction in which the provisional orientation flat 205 extends.

Then, the control unit 100 determines whether a step-like crack 208 developed from the modified layer 207 for inspection has been detected or not (step SP2). Specifically, providing the modified layer 207 for inspection extends along the X-axis in the captured image, the crack detector 103 of the control unit 100 operates to detect a crack 208 in the bare wafer 200 that extends from the modified layer 207 for inspection toward the Y-axis and/or toward the exposed reverse side 202 of the bare wafer 200. Stated otherwise, the crack detector 103 operates to detect a crack 208 extending from the modified layer 207 for inspection in a direction different from the direction in which the modified layer 207 for inspection extends, and exposed on the reverse side 202. The crack 208 is of a step-like shape with respect to the direction in which the modified layer 207 for inspection extends. If the crack detector 103 detects a step-like crack 208 (Yes in step SP2), then control goes to step SP3. If the crack detector 103 detects no step-like crack 208 (No in step SP2), then control goes to step SP6. If the crack detector 103 detects no step-like crack 208 (No in step SP2), any angular deviation of the direction in which the modified layer 207 for inspection extends remains in the angular deviation error range and hence meets accuracy requirements posed thereby. Stated otherwise, if the crack detector 103 detects no step-like crack 208 (No in step SP2), then the direction in which the modified layer 207 for inspection extends represents the crystal orientation of the bare wafer 200.

If the crack detector 103 detects a step-like crack 208 (Yes in step SP2), then the control unit 100 determines the direction of the crack 208 (step SP3). Specifically, the crack direction determiner 104 of the control unit 100 determines, through an image processing process, on which side of the Y-axis, i.e., a positive side or a negative side, the crack 208 detected by the crack detector 103 is localized and extended in the captured image. For example, with respect to the first modified layer $207_1$ for inspection depicted in FIG. 5-1A, the crack direction determiner 104 determines that the crack $208_1$ developed therefrom is localized and extended on the positive side of the Y-axis.

The control unit 100 then turns the chuck table 30 in the direction opposite to the direction of the crack 208 (step SP4). Specifically, in order to form a modified layer 207 for inspection again in the bare wafer 200, the table rotation command section 105 of the control unit 100 outputs a control signal to the rotating unit 60 to turn the chuck table 30 through a certain angle in the direction opposite to the side where the crack 208 has been localized and extended. According to the present embodiment, the table rotation command section 105 issues a control signal for turning the chuck table 30 through either one of the first through fourth indexing angles depending on the number of the steps of the crack 208 per unit length, to the rotating unit 60.

Then, the control unit 100 forms a modified layer 207 for inspection (step SP5). Specifically, the control unit 100 controls the X-axis moving unit 40 to move the chuck table 30 in the direction opposite to the processing-feed direction indicated by the arrow in FIG. 2 to place a desired position, where a laser beam is to start to be applied next, in the inspection area 206 directly below the beam condenser. As with step SP1, the control unit 100 controls the laser beam applying unit 70 to apply a laser beam while controlling the X-axis moving unit 40 to processing-feed the chuck table 30. In this manner, the inspection modified layer former 102 forms a modified layer 207 for inspection in the inspection area 206 by applying a laser beam to the inspection area 206 under the predetermined conditions along a direction that is angularly spaced from the previously formed modified layer 207 for inspection by the indexing angle through which the chuck table 30 has been turned in step SP4.

The processing from step SP1 to step SP5 is repeated until no step-like crack 208 is detected.

If the crack detector 103 detects no step-like crack 208 in step SP2, then the control unit 100 forms a modified layer $207_0$ for forming an orientation flat in the bare wafer 200 (step SP6). Specifically, the control unit 100 controls the X-axis moving unit 40 and the Y-axis moving unit 50 to move the chuck table 30 to place a position in the outer extra area 204 that is diametrically opposite to the provisional orientation flat 205 across the center of the bare wafer 200 directly below the beam condenser. While the X-axis moving unit 40 is moving the chuck table 30 along the X-axis, the orientation flat formation command section 106 of the control unit 100 controls the laser beam applying unit 70 to apply a laser beam under the processing conditions for the first pass to the outer extra area 204 along the direction in which the straight modified layer $207_4$ for inspection extends. When the application of the laser beam for the first pass is finished, the control unit 100 applies laser beams under the processing conditions for the second through fifth passes successively to the outer extra area 204 along the direction in which the straight modified layer $207_4$ for inspection extends. In this manner, the modified layer $207_0$ for forming an orientation flat is formed in the bare wafer 200.

After the modified layer $207_0$ for forming an orientation flat has been formed in the bare wafer 200, a dividing apparatus, not depicted, expands the modified layer $207_0$ for forming an orientation flat or exerts an external force to the modified layer $207_0$ in the bare wafer 200, breaking the bare wafer 200 from the modified layer $207_0$ that serves as a division initiating point. In this fashion, a true orientation flat 209 that meets the accuracy requirements posed by the angular deviation error range is thus formed in the bare wafer 200.

A process of forming a modified layer $207_0$ for forming an orientation flat in the bare wafer 200 using the laser processing apparatus 1 will be described below with reference to FIGS. 5-1A through 5-1D. It is assumed in the process that the provisional orientation flat 205 has an angular deviation of 0.1° from the crystal orientation of the bare wafer 200 by way of example.

First, after having set the range of the outer extra area 204 in the bare wafer 200, the control unit 100 forms a first modified layer $207_1$ for inspection in the outer extra area 204 parallel to the direction in which the provisional orientation flat 205 extends, as depicted in FIG. 5-1A (step SP1). At this time, a crack $208_1$ is extended from the first modified layer $207_1$ for inspection toward the exposed reverse side 202 of the bare wafer 200. The control unit 100 detects the crack $208_1$, which has a step-like pattern of six steps, in connection with the first modified layer $207_1$ for inspection (Yes in step SP2). Then, the control unit 100 determines the direction of the crack $208_1$ (step SP3). The control unit 100 turns the chuck table 30 through the first indexing angle of 0.05° in the negative side of the Y-axis (in the direction indicated by the arrow in FIG. 5-1A) opposite to the positive side of the Y-axis where the crack $208_1$ has been localized and extended (step SP4). The control unit 100 forms a second modified layer $207_2$ for inspection in the outer extra area 204 as depicted in FIG. 5-1B (step SP5). At this time, a crack $208_2$ is extended from the second modified layer $207_2$ for inspection toward the exposed reverse side 202 of the bare wafer 200.

The control unit 100 detects the crack $208_2$, which has a step-like pattern of four steps, in connection with the second modified layer $207_2$ for inspection (Yes in step SP2). Then, the control unit 100 determines the direction of the crack $208_2$ (step SP3). The control unit 100 turns the chuck table 30 through the first indexing angle of 0.05° in the negative side of the Y-axis (in the direction indicated by the arrow in FIG. 5-1B) opposite to the positive side of the Y-axis where the crack $208_2$ has been localized and extended (step SP4). The control unit 100 forms a third modified layer $207_3$ for inspection in the outer extra area 204 as depicted in FIG. 5-1C (step SP5). At this time, a crack $208_3$ is extended from the third modified layer $207_3$ for inspection toward the exposed reverse side 202 of the bare wafer 200.

The control unit 100 detects the crack $208_3$, which has a step-like pattern of three steps, in connection with the third modified layer $207_3$ for inspection (Yes in step SP2). Then, the control unit 100 determines the direction of the crack $208_3$ (step SP3). The control unit 100 turns the chuck table 30 through the first indexing angle of 0.05° in the negative side of the Y-axis (in the direction indicated by the arrow in FIG. 5-1C) opposite to the positive side of the Y-axis where the crack $208_3$ has been localized and extended (step SP4). The control unit 100 forms a fourth modified layer $207_4$ for inspection in the outer extra area 204 as depicted in FIG. 5-1D (step SP5). At this time, no crack is developed from the fourth modified layer $207_4$ for inspection.

The control unit 100 detects no crack in connection with the fourth modified layer $207_4$ for inspection, or stated otherwise, determines that only the fourth modified layer $207_4$ for inspection has been formed straight (No in step SP2). Now, the direction in which the fourth modified layer $207_4$ for inspection extends is recognized as the crystal orientation. Then, the control unit 100 forms a modified layer $207_0$ for forming an orientation flat in the outer extra area 204 parallel to the direction of the fourth modified layer $207_4$ for inspection (step SP6).

Another process of forming a modified layer $207_0$ for forming an orientation flat in the bare wafer 200 using the laser processing apparatus 1 will be described below with reference to FIGS. 5-2A and 5-2B. In FIGS. 5-2A and 5-2B, cracks $208_1$ and $208_2$ from modified layers $207_1$ and $207_2$ for inspection and a crack $208_3$ from a modified layer $207_3$ for inspection are developed in different directions. The modified layers $207_1$ and $207_2$ for inspection are formed in the same manner as those depicted in FIGS. 5-1A through 5-1D, and will not be described in detail below.

The control unit 100 detects the crack $208_3$, which has a step-like pattern of three steps, in connection with the third modified layer $207_3$ for inspection (Yes in step SP2), as depicted in FIG. 5-2A. Then, the control unit 100 determines the direction of the crack $208_3$ (step SP3). The control unit 100 turns the chuck table 30 through the second indexing angle of 0.02° in the positive side of the Y-axis (in the direction indicated by the arrow in FIG. 5-2A) opposite to the negative side of the Y-axis where the crack $208_3$ has been localized and extended (step SP4). The control unit 100 forms a fourth modified layer $207_4$ for inspection in the outer extra area 204 as depicted in FIG. 5-2B (step SP5). At this time, no crack is developed from the fourth modified layer $207_4$ for inspection.

According to the present embodiment, as described above, a modified layer 207 for inspection is formed in the bare wafer 200, and an image processing process is carried out on an image captured of a crack 208 developed from the modified layer 207 for inspection to determine whether the crack 208 is of a step-like pattern and on which side of the positive and negative sides of the Y-axis the step-like crack 208 is localized and extended. Therefore, it is possible to determine any angular deviation between the direction in which the modified layer 207 for inspection extends and the crystal orientation and the direction of such angular deviation. Furthermore, modified layers 207 for inspection are repeatedly formed at different angles until a straight modified layer 207 for inspection which is free of a step-like crack 208 is formed, based on the direction of an angular deviation between the determined direction in which the modified layer 207 for inspection extends and the crystal orientation. The direction in which such a straight crack-free modified layer 207 for inspection extends is recognized as the correct crystal orientation of the bare wafer 200.

According to the present embodiment, it is possible to recognize the correct crystal orientation of the bare wafer 200 in a shorter period of time and more accurately than if the operator visually determines whether a crack 208 is localized or not. In addition, the correct crystal orientation of the bare wafer 200 can be recognized with high accuracy regardless of how skilled the operator may be.

According to the present embodiment, it is possible to form a true orientation flat 209 representing the correct crystal orientation of the bare wafer 200, based on the recognized correct crystal orientation of the bare wafer 200. Projected dicing lines can be formed on the bare wafer 200 along the true orientation flat 209 representing the correct crystal orientation of the bare wafer 200. It is thus possible to form an orientation flat on the bare wafer 200 that meets accuracy requirements for a division initiating point.

Since the orientation flat on the bare wafer 200 meets accuracy requirements for a division initiating point, device chips that will be divided from a processed wafer can be produced with a high yield. The present invention is not limited to the above embodiment, but many changes and modifications may be made therein without departing from the scope of the invention.

Figure 7:
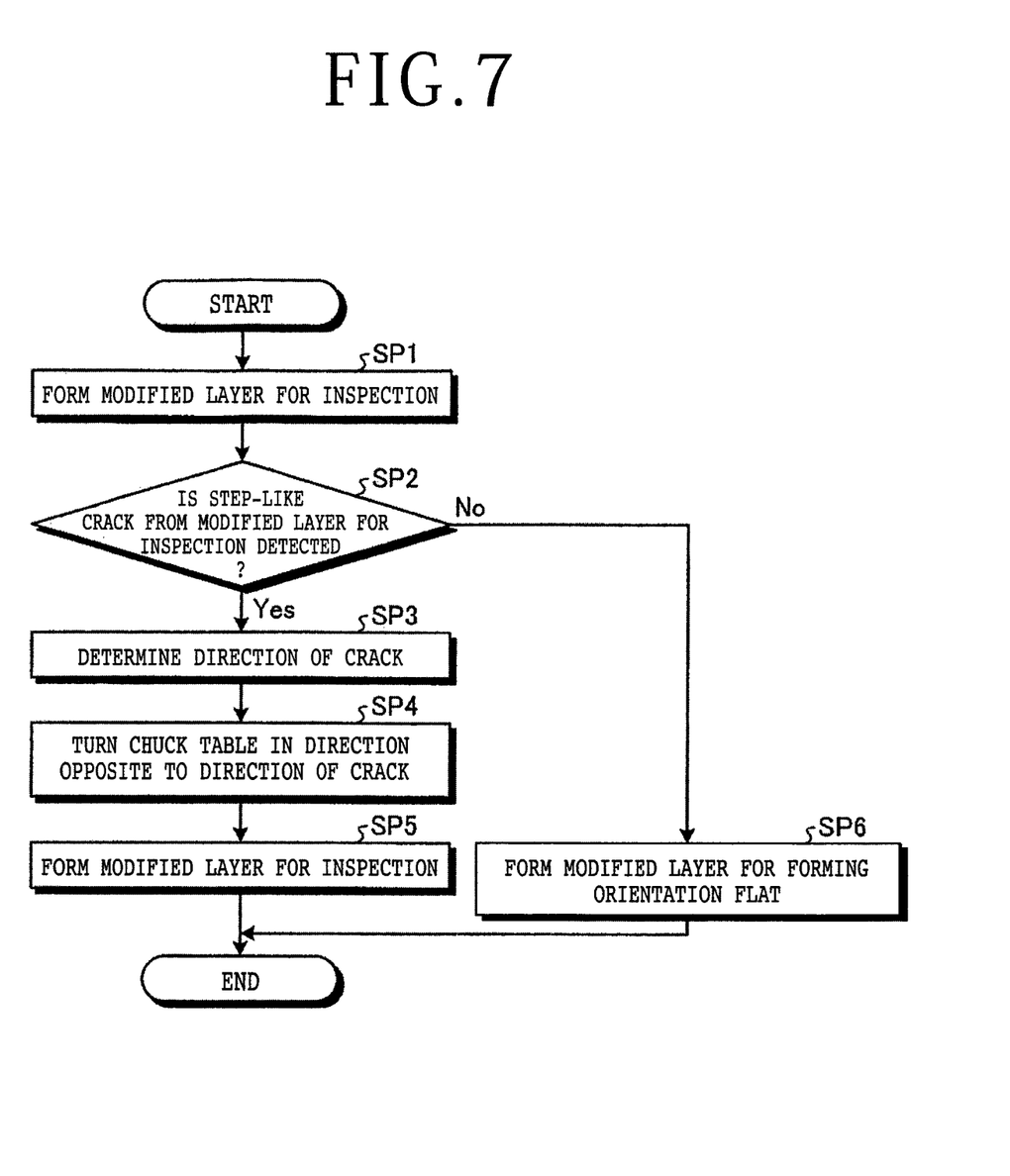
FIG. 7 is a flowchart of a process of determining the crystal orientation of a wafer and forming a modified layer in the wafer for producing an orientation flat on the wafer with the laser processing apparatus according to the embodiment.

In step SP6 of the process according to the flowchart depicted in FIG. 7, after the laser beam under the processing conditions for the first pass has been applied to the bare wafer 200, it may be confirmed according to an image processing process that no step-like crack has been developed from the formed modified layer.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus, comprising:
a chuck table and a bare wafer held by said chuck table, said chuck table being rotatable about its own axis, said bare wafer having a provisional orientation flat;
a laser beam applying unit configured to apply a laser beam having a wavelength that can be transmitted through the bare wafer held on said chuck table;
a camera for capturing an image of the bare wafer held on said chuck table; and
a control unit configured to control at least said chuck table, said laser beam applying unit, and said camera, wherein said control unit includes:
an inspection modified layer former detecting the provisional orientation flat of said bare wafer and applying a laser beam of a predetermined output power level to said bare wafer depending on the direction of said provisional orientation flat to form a modified layer for inspection in an inspection area located in an outer peripheral area of said bare wafer, and a crack detector detecting a crack extending from said modified layer toward a Y-axis, providing said modified layer extends along an X-axis in an image captured of said modified layer by said camera, and when said crack detector detects no crack, said control unit determines that the modified layer with no crack extends parallel to the crystal orientation of said bare wafer, and when said crack detector detects a crack, said control unit determines:

(a) a direction of the detected crack that represents a direction said modified layer deviates from the crystal orientation of said bare wafer, (b) rotates the chuck table through a designated indexing angle in a direction opposite to the direction of the detected crack, and (c) forming another modified layer for inspection in the inspection area located in the outer peripheral area of said bare wafer, and (d) repeating steps (a), (b) and (c) until the crack detector detects no cracks or a crack having a smaller number of steps than a predetermined step count per unit length.

2. The laser processing apparatus according to claim 1, wherein said control unit further includes a crack direction determiner determining according to an image processing process on which side of positive and negative sides of said Y-axis said crack detected by said crack detector is localized and extended, and a table rotation command section configured to turn said chuck table through a predetermined angle in a direction opposite to the direction in which said crack is localized and extended to form another modified layer for detecting the crystal orientation in said bare wafer, and said predetermined angle through which to turn said chuck table is established depending on an angular deviation error range of said provisional orientation flat with respect to the crystal orientation.

3. The laser processing apparatus according to claim 1, wherein said control unit further includes an orientation flat formation command section configured to, if said crack detector detects no crack, apply a laser beam having an output power level higher than said predetermined output power level to said bare wafer in a direction parallel to the modified layer with no crack extending therefrom, to thereby form a modified layer in an outer peripheral area of said bare wafer as a true orientation flat in said bare wafer.

4. The laser processing apparatus according to claim 1, wherein said bare wafer includes a GaN wafer.

5. The laser processing apparatus according to claim 2, said predetermined angle through which to turn said chuck table is one of: a first indexing angle of 0.05°, a second indexing angle of 0.02°, a third indexing angle of 0.01° or a fourth indexing angle of 0.005°.

6. The laser processing apparatus according to claim 1, wherein said control unit further includes an orientation flat formation command section configured to form an orientation flat in said bare wafer diametrically opposite to said provisional orientation flat across a center of said bare wafer.

7. The laser processing apparatus according to claim 1, wherein the modified layer for inspection in the inspection area has a length of 5 mm to 20 mm.

* * * * *